(12) United States Patent
Lee et al.

(10) Patent No.: US 9,188,288 B2
(45) Date of Patent: Nov. 17, 2015

(54) LED EMITTER WITH IMPROVED WHITE COLOR APPEARANCE

(71) Applicants: Hsiao-Wen Lee, Hsinchu (TW);
Chi-Xiang Tseng, Kaohsiung (TW);
Yu-Sheng Tang, Kaohsiung County (TW); Jung-Tang Chu, Miaoli County (TW)

(72) Inventors: Hsiao-Wen Lee, Hsinchu (TW);
Chi-Xiang Tseng, Kaohsiung (TW);
Yu-Sheng Tang, Kaohsiung County (TW); Jung-Tang Chu, Miaoli County (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 329 days.

(21) Appl. No.: 13/629,677

(22) Filed: Sep. 28, 2012

(65) Prior Publication Data
US 2014/0091329 A1      Apr. 3, 2014

(51) Int. Cl.
*H01L 33/00*       (2010.01)
*F21K 99/00*       (2010.01)
*H01L 25/075*      (2006.01)
*H01L 33/50*       (2010.01)
*F21S 6/00*        (2006.01)
*F21Y 101/02*      (2006.01)
*F21V 29/74*       (2015.01)

(52) U.S. Cl.
CPC .............. *F21K 9/00* (2013.01); *H01L 25/0753* (2013.01); *F21K 9/90* (2013.01); *F21S 6/00* (2013.01); *F21V 29/74* (2015.01); *F21Y 2101/02* (2013.01); *H01L 33/50* (2013.01)

(58) Field of Classification Search
CPC ......... H01L 33/60; H01L 33/20; H01L 33/62; H01L 33/54; H01L 33/58
USPC ...................... 257/79, 84, 88, 81, 98, 99, 100
See application file for complete search history.

(56) References Cited

U.S. PATENT DOCUMENTS

2011/0084296 A1*   4/2011   Cheng ............................. 257/98
2012/0138978 A1*   6/2012   Tsang ............................. 257/89
2013/0187178 A1*   7/2013   Tischler ......................... 257/88

* cited by examiner

*Primary Examiner* — Hoa B Trinh
(74) *Attorney, Agent, or Firm* — Muncy, Geissler, Olds & Lowe, P.C.

(57) ABSTRACT

A lighting apparatus includes a substrate, a plurality of light-emitting dies, a continuous encapsulation structure, and a gel. The plurality of light-emitting dies are disposed on the substrate and spaced apart from one another. The light-emitting dies each are covered with a respective individual phosphor coating conformally. The continuous encapsulation structure has a curved surface disposed over the substrate and encapsulates the light-emitting dies within. The gel is disposed between the encapsulation structure and the phosphor coating for each of the light-emitting dies. The gel contains diffuser particles. The lighting apparatus has a substantially white appearance in an off state when the plurality of light-emitting dies is turned off.

18 Claims, 5 Drawing Sheets

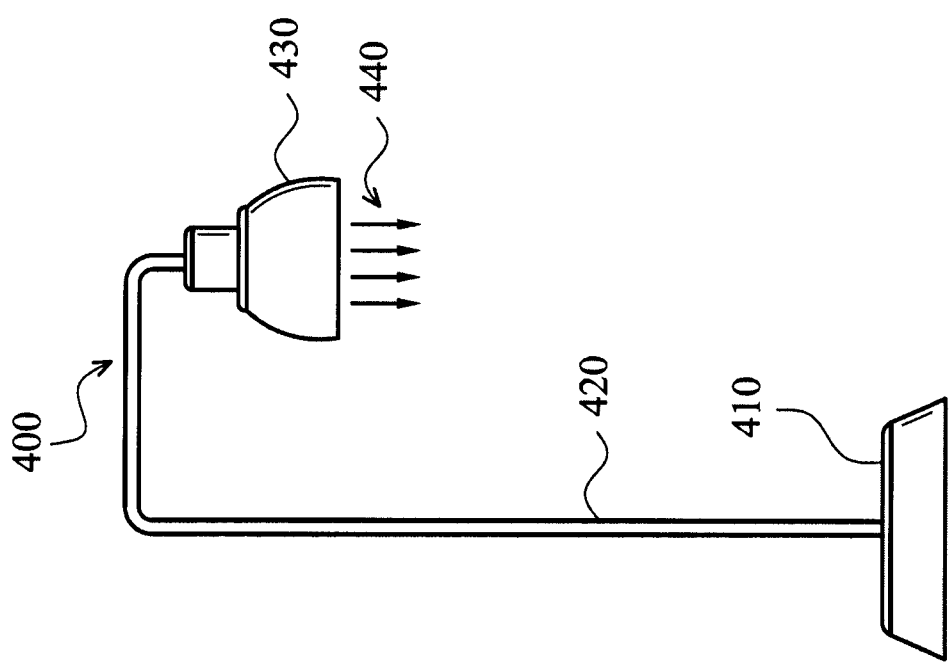

LED EMITTER WITH IMPROVED WHITE COLOR APPEARANCE

TECHNICAL FIELD

The present disclosure relates generally to light-emitting devices, and more particularly, to a light-emitting diode (LED) lighting instrument having improved white color appearance.

BACKGROUND

LEDs are semiconductor photonic devices that emit light when a voltage is applied. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, back light unit for LCD displays, and other suitable illumination apparatuses. For example, LEDs are often used in illumination apparatuses provided to replace conventional incandescent light bulbs, such as those used in a typical lamp.

One of the performance criteria for LED lighting instruments involve its color appearance. For example, it is desirable for an LED lighting instrument to maintain a substantially white appearance even as it is turned off, since that is more pleasing for the human eye and better resembles a traditional non-LED lamp. However, existing LED lighting instruments often suffer from non-white appearances when they are turned off. For example, conventional LED light bulbs may still take on a yellowish appearance when they are turned off.

Therefore, although existing LED lighting instruments are generally adequate for their intended purposes, they have not been entirely satisfactory in every aspect. An LED lighting instrument capable of producing a substantially white appearance when it is turned off continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not necessarily drawn to scale or according to the exact geometries. In fact, the dimensions of the various features may be arbitrarily increased or reduced for clarity of discussion.

FIG. 5 is a diagrammatic view of a lighting module that includes a photonic lighting apparatus of FIGS. 1-3 according to various aspects of the present disclosure.

SUMMARY OF THE DISCLOSURE

Figure 1:
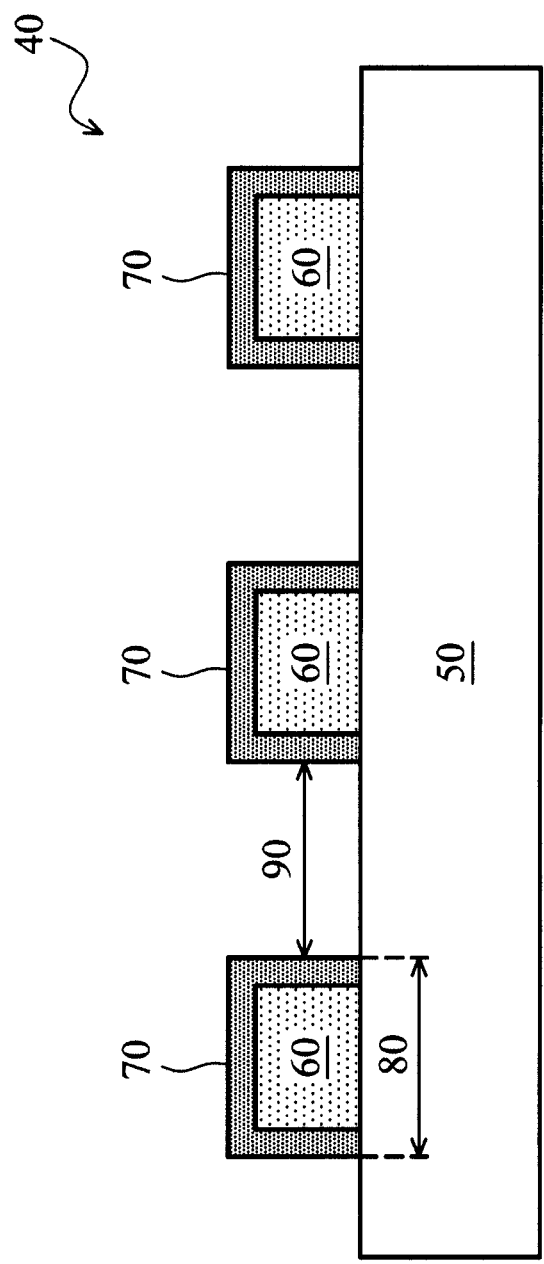
FIG. 1-2 are diagrammatic fragmentary cross-sectional side view of an example lighting apparatus using a semiconductor photonic device as a light source according to various aspects of the present disclosure.

A lighting apparatus includes a substrate, a plurality of light-emitting dies, a continuous encapsulation structure, and a gel. The plurality of light-emitting dies are disposed on the substrate and spaced apart from one another. The light-emitting dies each are covered with a respective individual phosphor coating conformally. The continuous encapsulation structure has a curved surface disposed over the substrate and encapsulates the light-emitting dies within. The gel is disposed between the encapsulation structure and the phosphor coating for each of the light-emitting dies. The gel contains diffuser particles. The lighting apparatus has a substantially white appearance in an off state when the plurality of light-emitting dies is turned off.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diode (LED) devices. When turned on, LEDs may emit radiation such as different colors of light in a visible spectrum, as well as radiation with ultraviolet or infrared wavelengths. Compared to traditional light sources (e.g., incandescent light bulbs), lighting instruments using LEDs as light sources offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LED-based lighting instruments in recent years.

Nevertheless, existing LED-based lighting instruments may face certain shortcomings. One such shortcoming pertains to unsatisfactory color appearance in an off state. In more detail, LEDs may rely on a phosphor material to convert its light output from one color to another. For example, a phosphor material may be used to convert a blue light produced by an LED emitter to a more white light. However, conventional techniques of applying the phosphor may lead to an LED lighting instrument having a non-white appearance even when it is turned off, which is undesirable.

According to various aspects of the present disclosure, described below is an LED lighting instrument having substantially improved white appearance in its off state. Referring to FIG. 1, a diagrammatic fragmentary cross-sectional side view of a portion of a lighting instrument 40 (or a light module) is illustrated according to some embodiments of the present disclosure. The lighting instrument 40 includes a substrate 50. In some embodiments, the substrate 50 includes a Metal Core Printed Circuit Board (MCPCB). The MCPCB includes a metal base that may be made of Aluminum (or an alloy thereof). The MCPCB also includes a thermally conductive but electrically insulating dielectric layer disposed on the metal base. The MCPCB may also include a thin metal layer made of copper that is disposed on the dielectric layer. In other embodiments, the substrate 50 may include other suitable materials, for example ceramic or silicon. The substrate 50 may contain active circuitry and may also be used to establish interconnections.

The lighting instrument 40 includes a plurality of semiconductor photonic dies 60 located on the substrate 50. The semiconductor photonic dies function as light sources for the lighting instrument 40. The semiconductor photonic dies 60 are LED dies in the embodiments described below, and as such may be referred to as LED dies 60 in the following paragraphs. In the embodiments discussed herein, the LED dies 60 are physically spaced apart from one another.

The LED dies 60 each include two oppositely doped semiconductor layers. Alternatively stated, these oppositely doped semiconductor layers have different types of conductivity. For example, one of these semiconductor layers contains a material doped with an n-type dopant, while the other one of the two semiconductor layers contains a material doped with a p-type dopant. In some embodiments, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In certain embodiments, the oppositely doped semiconductor layers include a p-doped gallium nitride (GaN) material and an n-doped gallium nitride material, respectively. The p-type dopant may include Magnesium (Mg), and the n-type dopant may include Carbon (C) or Silicon (Si).

The LED dies 60 also each include a light emitting layer such as a multiple-quantum well (MQW) layer that is disposed in between the oppositely doped layers. The MQW layer includes alternating (or periodic) layers of active material, such as gallium nitride and indium gallium nitride (InGaN). For example, the MQW layer may include a number of gallium nitride layers and a number of indium gallium nitride layers, wherein the gallium nitride layers and the indium gallium nitride layers are formed in an alternating or periodic manner. In some embodiments, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency depends on the number of layers of alternating layers and thicknesses. In certain alternative embodiments, suitable light-emitting layers other than an MQW layer may be used instead.

Each LED die may also include a pre-strained layer and an electron-blocking layer. The pre-strained layer may be doped and may serve to release strain and reduce a Quantum-Confined Stark Effect (QCSE)—describing the effect of an external electric field upon the light absorption spectrum of a quantum well—in the MQW layer. The electron blocking layer may include a doped aluminum gallium nitride (AlGaN) material, wherein the dopant may include Magnesium. The electron blocking layer helps confine electron-hole carrier recombination to within the MQW layer, which may improve the quantum efficiency of the MQW layer and reduce radiation in undesired bandwidths.

The doped layers and the MQW layer may all be formed by one or more epitaxial growth processes known in the art. For example, these layers may be formed by processes such as metal organic vapor phase epitaxy (MOVPE), molecular-beam epitaxy (MBE), metal organic chemical vapor deposition (MOCVD), hydride vapor phase epitaxy (HVPE), liquid phase epitaxy (LPE), or other suitable processes. These processes may be performed at suitable deposition processing chambers and at high temperatures ranging from a few hundred degrees Celsius to over one thousand degrees Celsius.

After the completion of the epitaxial growth processes, an LED is created by the disposition of the MQW layer between the doped layers. When an electrical voltage (or electrical charge) is applied to the doped layers of the LED 60, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer. For example, the LED dies 60 herein may be blue LED emitters, in other words, they are configured to emit blue light. The LED dies 60 may also include electrodes or contacts that allow the LED dies 60 to be electrically coupled to external devices.

As is shown in FIG. 1, each LED die 60 is also coated with a phosphor film (or a phosphor coating) 70. In various embodiments, the phosphor film 70 is conformally coated around the various surfaces (for example the top surface and the side surfaces) of each LED die 60. The phosphor film 70 may include either phosphorescent materials and/or fluorescent materials. The phosphor film 70 is used to transform the color of the light emitted by an LED dies 60. In some embodiments, the phosphor film 70 contains yellow phosphor particles and can transform a blue light emitted by an LED die 60 into a different wavelength light. By changing the material composition of the phosphor film 70, the desired light output color (e.g., a color resembling white) may be achieved. The phosphor film 70 may be coated on the surfaces of the LED dies 60 in a concentrated viscous fluid medium (e.g., liquid glue). As the viscous liquid sets or cures, the phosphor material becomes a part of the LED package.

The phosphor film 70 for each LED die 60 is physically separated and spaced apart from the phosphor films 70 for other LED dies 60, for example from the phosphor films 70 coated around adjacent LED dies 60. Therefore, the phosphor film 70 may be said to be coated on each of the LED dies 60 in a localized fashion. In some embodiments, a bulk phosphor film may be coated around a plurality of LED dies collectively, and the phosphor-coated LED dies may then be separated and then placed on the substrate 50 to ensure that the phosphor films 70 are not in contact with one another. In other embodiments, the phosphor films 70 may be individually coated on each LED die 60 to ensure physical separation between the phosphor films 70.

The fact that each LED die 60 is coated with a respective localized phosphor film 70 according to the present disclosure is advantageous, for example with respect to producing a white appearance when the LED die 60 is in an off state. In more detail, for many conventional LED lighting instruments, a bulk phosphor material (or a volume phosphor) is coated around a plurality of LED dies. The color of the phosphor particles of the bulk phosphor material may affect the overall color appearance even when the LED dies are not actively emitting light (i.e., in an off state). For example, if the bulk phosphor contains primarily yellow phosphor particles, the overall color appearance of the conventional LED dies may take on a yellowish tone in an off state. In other words, the conventional LED dies look yellowish when they are not turned on. This is undesirable because a yellowish off-state appearance for a lighting instrument is not aesthetically pleasing for the human eye.

In comparison, according to aspects of the present disclosure, the phosphor films 70 are coated locally around each LED die 60, rather than around all the LED dies 60 as a whole. This localized phosphor coating scheme reduces the overall amount of phosphor particles such as yellow phosphor particles. For example, since the spaces between the adjacent LED dies 60 are free of phosphor coating, no phosphor particles are disposed between adjacent LED dies 60. In addition, the amount of phosphor particles located over the LED dies 60 are also reduced due to the localized phosphor coating. As a result, the overall color appearance for the LED dies 60 may be less yellow and more white compared to conventional LED dies. Thus, the lighting instrument of the present disclosure (i.e., utilizing the LED dies 60) is also able to produce a substantially white appearance in its off state.

Note that yellow phosphor particles are used herein merely as an example to illustrate the effect of colored phosphor particles on the color appearance of the LED dies. The same concept may apply if the phosphor contains red, green, or phosphor particles of other different colors.

Although the more white appearance is one of the advantages of the embodiments of the lighting instrument shown herein, it is not the only advantage, nor is it required for all embodiments. Other embodiments may offer different advantages that are not necessarily discussed herein.

In some embodiments, the spacing between the adjacent phosphor-coated LED dies 60 is configured to minimize the influence from colored phosphor particles while not sacrificing chip area too much. In more detail, the greater the distance that separates the adjacent LED dies 60, the more the overall color appearance will approach a white color. However, the greater distance between adjacent LED dies 60 results in a larger chip area, which is costly, cumbersome, and inefficient. Hence, an optimization trade-off may be made to select a die separation distance range that achieves good white color appearance and still maintains a small enough chip package.

For example, as is shown in FIG. 1, each phosphor-coated LED die 60 may have a horizontal or lateral dimension 80, and an optimized spacing between adjacent phosphor-coated LED dies 60 may be measured by an optimized distance 90. Accordingly, there is a correlation between the lateral dimension 80 of the phosphor-coated LED die 60 and the optimized distance 90 separating these dies. In other words, the optimized distance 90 may be defined as a function of the lateral dimension 80, or vice versa.

Figure 2:
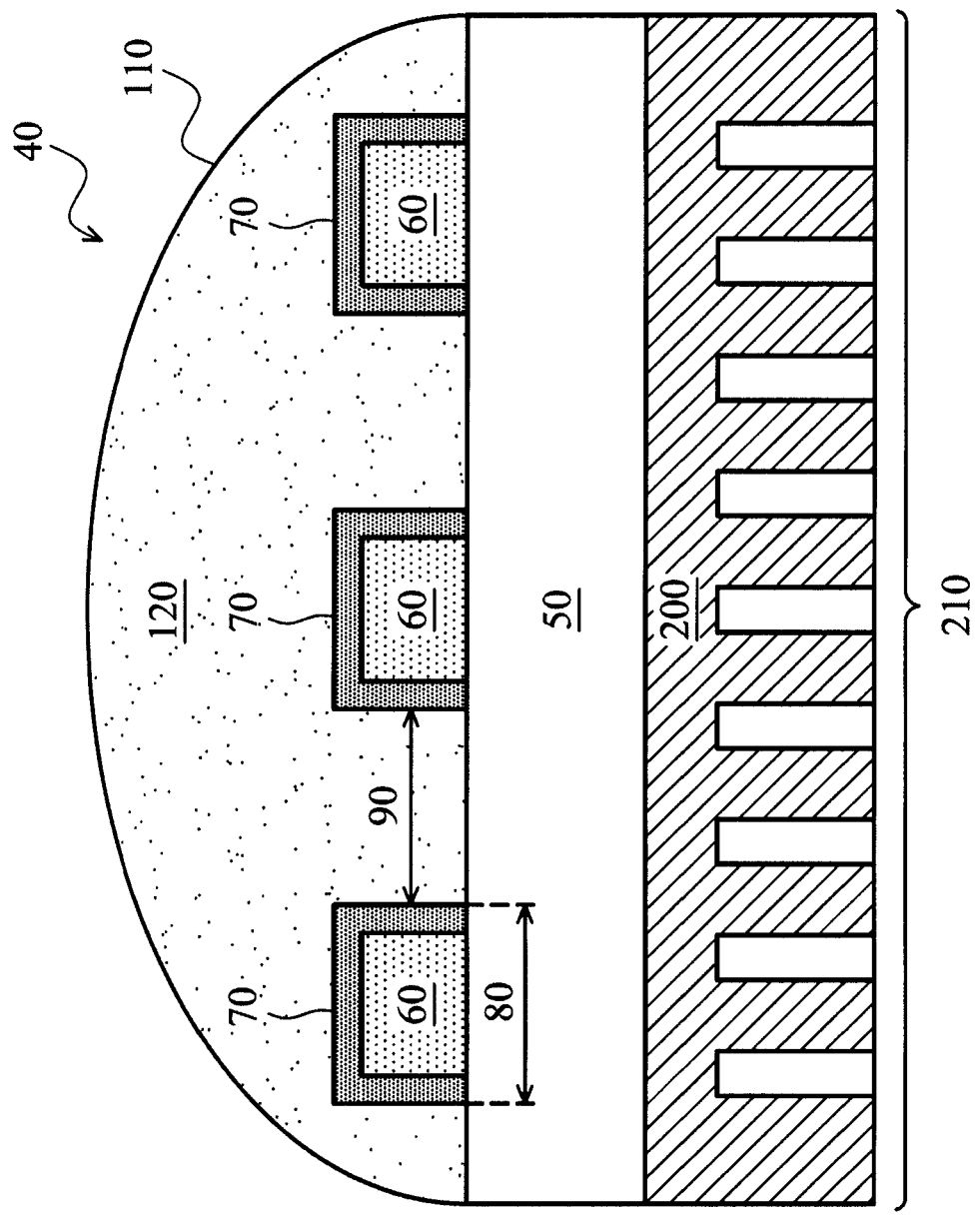

Referring now to FIG. 2, a more detailed illustration of the lighting instrument 40 is shown as a diagrammatic cross-sectional side view. The lighting instrument 40 includes a plurality of LED dies 60 disposed on the substrate 50. As discussed above, the LED dies 60 are each coated with a phosphor film 70 in a localized fashion, such that the phosphor films 70 coated around different LED dies 60 are not in physical contact with one another.

The lighting instrument 40 also includes a diffuser cap 110. The diffuser cap 110 provides a cover for the LED dies 60 therebelow. Stated differently, the LED dies 60 may be encapsulated by the diffuser cap 110 and the substrate 50 collectively. The substrate 50 may or may not be completely covered by the diffuser cap 110. In some embodiments, the diffuser cap 110 has a curved surface or profile. In some embodiments, the curved surface may substantially follow the contours of a semicircle, so that each beam of light emitted by the LED dies 60 may reach the surface of the diffuser cap 110 at a substantially right incident angle, for example, within a few degrees of 90 degrees. The curved shape of the diffuser cap 110 helps reduce Total Internal Reflection (TIR) of the light emitted by the LED dies 60. In some embodiments, the diffuser cap 110 has a textured surface for further scattering of the incident light.

In some embodiments, the space between the LED dies 60 and the diffuser cap 110 may be filled by an optical-grade silicone-based adhesive material 120, also referred to as an optical gel 120. Diffuser particles may be mixed within the optical gel 120 in these embodiments so as to further diffuse light emitted by the LED dies 60. In other embodiments, the space between the LED dies 60 and the diffuser cap 110 may be filled by air.

The substrate 50 is located on a thermal dissipation structure 200, also referred to as a heat sink 200. The heat sink 200 is thermally coupled to the LED dies 60 through the substrate 50. The heat sink 200 is configured to facilitate heat dissipation to the ambient atmosphere. The heat sink 200 contains a thermally conductive material, such as a metal material. The shape and geometries of the heat sink 200 may be designed to provide a framework for a familiar light bulb while at the same time spreading or directing heat away from the LED dies 60. To enhance heat transfer, the heat sink 200 may have a plurality of fins 210 that protrude outwardly from a body of the heat sink 200. The fins 210 may have substantial surface area exposed to ambient atmosphere to facilitate heat transfer. In some embodiments, a thermally conductive material may be disposed between the substrate 50 and the heat sink 200. For example, the thermally conductive material may include thermal grease, metal pads, solder, etc. The thermally conductive material further enhances heat transfer from the LED dies 60 to the heat sink 200.

Figure 3:
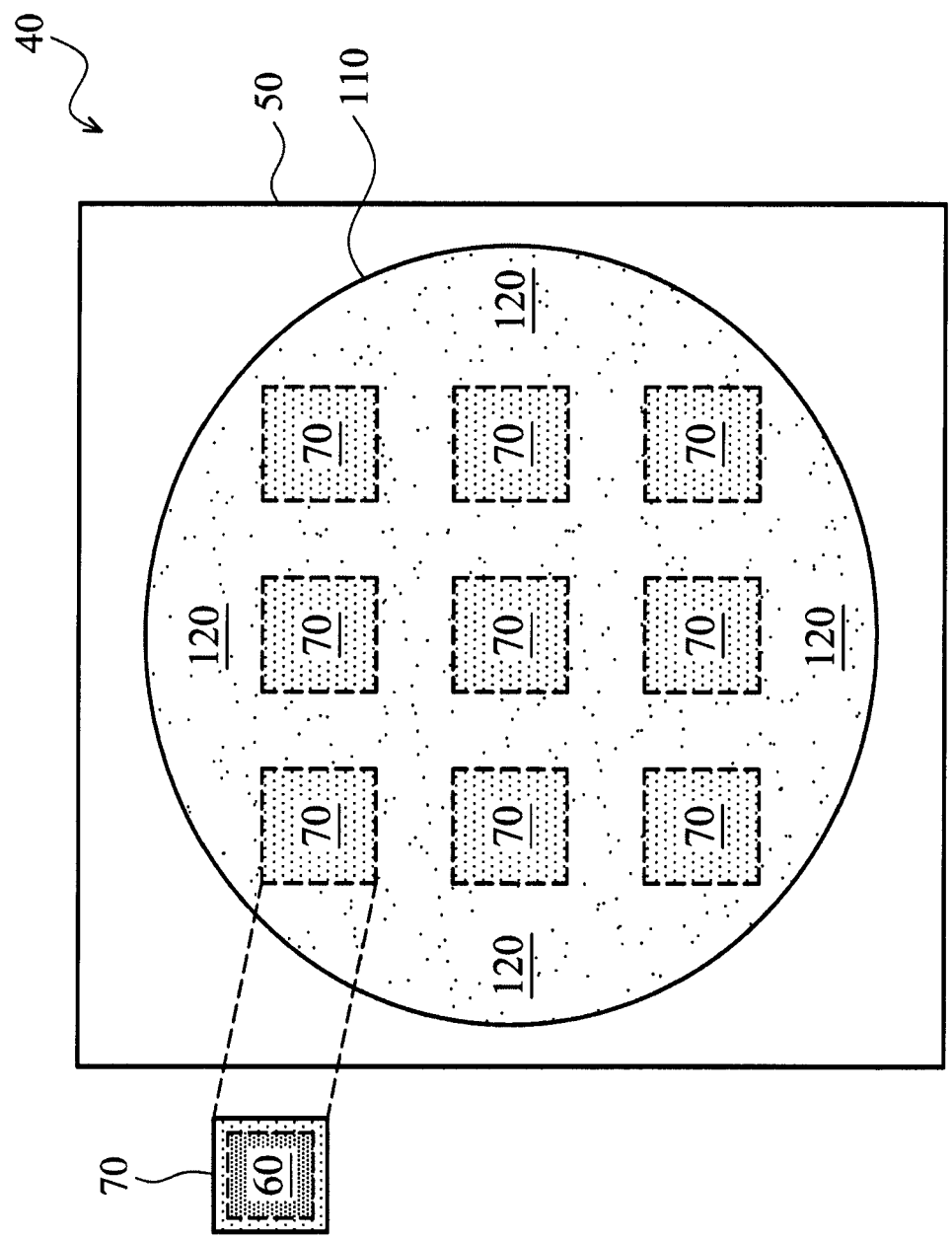
FIG. 3 is a diagrammatic fragmentary top view of an example lighting apparatus according to various aspects of the present disclosure.

FIG. 3 is a simplified diagrammatic top view of the lighting instrument 40 according to some embodiments. For the sake of providing an example, nine phosphor-coated LED dies 60 are secured to the substrate 50 and are arranged in three rows and three columns. In other embodiments, any other number of LED dies may be used and may be arranged in other suitable configurations. These LED dies 60 and their respective phosphor films 70 are covered by a diffusive and transparent gel 120, which is housed by a diffuser cap 110.

Since the LED dies 60 are each coated by the phosphor film 70, they are not directly visible in the top view in FIG. 3. Therefore, one of the phosphor-coated LED dies 60 is illustrated separately near the top left corner of FIG. 3 to specifically show the contours or boundaries of the LED die 60. The boundaries of the LED die 60 are shown as broken lines, so as to indicate that the LED die 60 is not directly visible since it is covered by the phosphor film 70. Similarly, the phosphor films 70 are not directly visible in the top view either, since they covered by the diffusive gel 120. But for the sake of illustration, the contours or boundaries of the phosphor films 70 are still shown herein as broken lines.

As discussed above, unlike conventional LED-based lighting instruments, the phosphor films 70 are coated locally around each LED die 60 in the lighting instrument 40, rather than being coated as a volume phosphor around all of the LED dies collectively. Therefore, the phosphor films 70 herein are separated from other phosphor films, thereby reducing the presence of the colored phosphor particles under the diffuser cap 110. As such, the overall color appearance for the LED dies may be less yellow compared to conventional LED dies.

Figure 4:
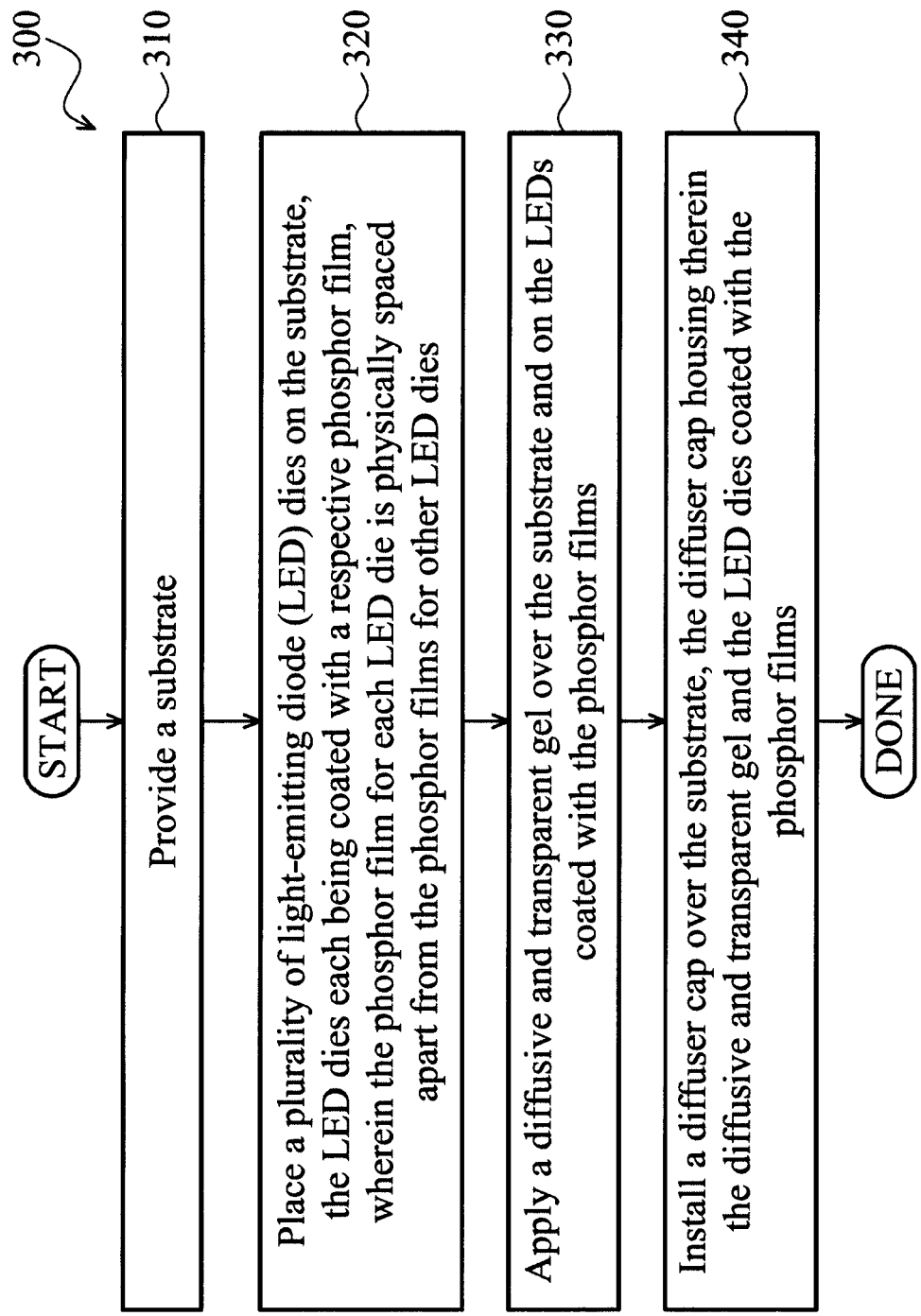
FIG. 4 is a flowchart illustrating a method of fabricating a lighting apparatus using a semiconductor photonic device as a light source according to various aspects of the present disclosure.

FIG. 4 is a flowchart of a method 300 for fabricating a lighting apparatus using a semiconductor photonic device as a light source according to various aspects of the present disclosure. The method 300 includes a step 310, in which a substrate is provided. The substrate may be a PCB substrate, a ceramic substrate, a silicon substrate, or another suitable substrate. The method 300 includes a step 320, in which a plurality of LED dies is placed on the substrate. The LED dies are each coated with a respective phosphor film. The phosphor film for each LED die is conformally coated around the LED die. The phosphor film for each LED die is physically spaced apart from the phosphor films for other LED dies. In some embodiments, the step 320 includes configuring an optimal separation distance between adjacent phosphor-coated LED dies. The optimal separation distance is a function of a lateral dimension of one of the phosphor-coated LED dies. The method 300 includes a step 330, in which a diffusive and transparent gel is applied over the substrate and on the LEDs coated with the phosphor films. The method 300 includes a step 340, in which a diffuser cap is installed over the substrate. The diffuser cap provides a housing for the diffusive and transparent gel and the LED dies coated with the phosphor films.

Additional processes may be performed before, during, or after the blocks 310-340 discussed herein to complete the fabrication of the lighting apparatus. For the sake of simplicity, these additional processes are not discussed herein.

FIG. 5 illustrates a simplified diagrammatic view of a lighting module 400 that includes some embodiments of the lighting instrument 40 discussed above. The lighting module 400 has a base 410, a body 420 attached to the base 410, and a lamp 430 attached to the body 420. In some embodiments, the lamp 430 is a down lamp (or a down light lighting module).

The lamp 430 includes the lighting instrument 40 discussed above with reference to FIGS. 1-4. In other words, the lamp 430 of the lighting module 400 includes an LED-based light source, wherein the LED dies are phosphor coated in a localized manner. Due at least in part to the advantages discussed above, the LED packaging for the lamp 430 can take on a substantially white appearance in its off state, whereas conventional LED lighting instruments often times look yellow when they are turned off.

One of the broader forms of the present disclosure involves a lighting apparatus. The lighting apparatus includes: a substrate; a plurality of light-emitting dies disposed on the substrate and spaced apart from one another, the light-emitting dies each being covered with a respective individual phosphor coating; and an encapsulation structure disposed over the substrate and encapsulating the light-emitting dies within; wherein the lighting apparatus has a substantially white appearance at an off state.

In some embodiments, the lighting apparatus further includes: a gel disposed between the encapsulation structure and the light-emitting dies.

In some embodiments, the diffusive gel is transparent and contains diffuser particles.

In some embodiments, the light-emitting dies each include a light-emitting diode (LED).

In some embodiments, the light-emitting dies are each configured to emit blue light.

In some embodiments, the encapsulation structure includes a diffuser cap configured to scatter light.

In some embodiments, the phosphor coating is conformally coated around each light-emitting die.

In some embodiments, the phosphor coating for each respective light-emitting die is separated from the phosphor coatings for adjacent light-emitting dies by a distance.

In some embodiments, the distance is a function of a lateral dimension of the LED die.

Another one of the broader forms of the present disclosure involves a photonic lighting module. The photonic lighting module includes: a board; one or more light-emitting diodes (LEDs) located on the board; a localized phosphor film coated around each of the one or more LEDs in a manner such that the one or more LEDs take on a substantially white appearance when the one or more LEDs are not actively emitting light; and a diffuser cap located over the board and housing the one or more LEDs within.

In some embodiments, the photonic lighting module further includes a diffusive and transparent material located on the one or more LED dies and housed within the diffuser cap.

In some embodiments, the one or more LEDs are each configured to emit blue light; and the phosphor film contains yellow phosphor particles.

In some embodiments, the one or more LEDs include a plurality of LEDs spaced part from one another.

In some embodiments, the phosphor film for each LED is free of being in physical contact with other phosphor films for other LEDs.

In some embodiments, a spacing between adjacently-located LEDs is correlated with a size of the LEDs.

In some embodiments, the phosphor film is conformally coated around each of the one or more LEDs.

Still another one of the broader forms of the present disclosure involves a method of fabricating a lighting apparatus. The method includes: providing a substrate; placing a plurality of light-emitting diode (LED) dies on the substrate, the LED dies each being coated with a respective phosphor film, wherein the phosphor film for each LED die is physically spaced apart from the phosphor films for other LED dies, and wherein the LED dies are placed on the substrate according to an optimal separation distance between adjacent LED dies; applying a diffusive and transparent gel over the substrate and on the LEDs coated with the phosphor films; and installing a diffuser cap over the substrate, the diffuser cap housing therein the diffusive and transparent gel and the LED dies coated with the phosphor films.

In some embodiments, the phosphor film for each LED die is conformally coated around the LED die.

In some embodiments, the optimal separation distance is a function of a lateral dimension of one of the LED dies.

In some embodiments, the placing the plurality of LED dies is performed in a manner such that the LED dies assume a substantially white appearance when the LED dies are turned off.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lighting apparatus, comprising:
   a substrate;
   a plurality of light-emitting dies disposed on the substrate and spaced apart from one another, the light-emitting dies each being covered with a respective individual phosphor coating conformally;

a continuous encapsulation structure having a curved surface disposed over the substrate and encapsulating the plurality of light-emitting dies within; and a gel disposed between the encapsulation structure and the phosphor coating for each of the light-emitting dies, wherein the gel contains diffuser particles;

wherein the lighting apparatus has a substantially white appearance when the plurality of light-emitting dies is turned off.

2. The lighting apparatus of claim 1, wherein the gel is transparent and is in direct physical contact with outer surfaces of the individual phosphor coating for each light-emitting die.

3. The lighting apparatus of claim 1, wherein the light-emitting dies each include a light-emitting diode (LED).

4. The lighting apparatus of claim 1, wherein the light-emitting dies are each configured to emit blue light.

5. The lighting apparatus of claim 1, wherein the encapsulation structure includes a diffuser cap configured to scatter light.

6. The lighting apparatus of claim 1, wherein the phosphor coating for each respective light-emitting die is separated from the phosphor coatings for adjacent light-emitting dies by a distance.

7. The lighting apparatus of claim 6, wherein the distance is a function of a lateral dimension of the light-emitting die.

8. A photonic lighting module, comprising:
a board;
a plurality of light-emitting diodes (LEDs) located on the board;
a localized phosphor film conformally coated around each of the plurality of LEDs in a manner such that the photonic lighting module has a substantially white appearance when the plurality of LEDs is turned off; and
a continuous cap having a curved surface located over the board and housing the plurality of LEDs within; and
a diffusive and transparent material located over the localized phosphor film for each of the plurality of LEDs, wherein the diffusive and transparent material is housed within the cap.

9. The photonic lighting module of claim 8, wherein the diffusive and transparent material is in direct physical contact with outer surfaces of the localized phosphor film coated around each of the plurality of LEDs.

10. The photonic lighting module of claim 8, wherein:
the plurality of LEDs is each configured to emit blue light; and
the localized phosphor film contains yellow phosphor particles.

11. The photonic lighting module of claim 8, wherein the plurality of LEDs is spaced part from one another.

12. The photonic lighting module of claim 11, wherein the localized phosphor film for each LED is free of being in physical contact with other phosphor films for other LEDs.

13. The photonic lighting module of claim 11, wherein a spacing between adjacently-located LEDs is correlated with a size of the LEDs.

14. A lighting apparatus, comprising:
a substrate, wherein the substrate is a printed circuit board (PCB), a ceramic substrate, or a silicon substrate;
a plurality of light-emitting diode (LED) dies located over the substrate, the LED dies each being coated with a respective phosphor film conformally, wherein the phosphor film for each LED die is physically spaced apart from the phosphor films for other LED dies, and wherein each LED die is separated from adjacent LED dies according to a predetermined optimal separation distance;
a diffusive and transparent gel located over the substrate and over the LEDs; and
a continuous cap having a curved surface located over the substrate, the cap housing therein the diffusive and transparent gel and the plurality of LED dies;
wherein the lighting apparatus has a substantially white appearance when the LED dies are turned off.

15. The lighting apparatus of claim 14, wherein the optimal separation distance is a function of a lateral dimension of one of the LED dies.

16. The lighting apparatus of claim 1, wherein the substrate is a printed circuit board (PCB), a ceramic substrate, or a silicon substrate.

17. The lighting apparatus of claim 14, further comprising a heat sink wherein the substrate is located on the heat sink and the heat sink is thermally coupled to the LED dies through the substrate.

18. The lighting apparatus of claim 17, wherein the heat sink has a plurality of fins that protrude outwardly from a body of the heat sink.

* * * * *